United States Patent
Van Lydegraf

(10) Patent No.: US 6,897,548 B2
(45) Date of Patent: May 24, 2005

(54) SEMICONDUCTOR DIFFERENTIAL INTERCONNECT

(75) Inventor: Curt N. Van Lydegraf, Eagle, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/613,496

(22) Filed: Jul. 2, 2003

(65) Prior Publication Data

US 2005/0001242 A1 Jan. 6, 2005

(51) Int. Cl.⁷ .......................... H01L 29/40; H01L 39/00
(52) U.S. Cl. .................... 257/664; 257/659; 257/660; 257/661; 257/662; 257/663; 438/112; 438/124; 438/127
(58) Field of Search ................... 257/659–664; 438/112, 124, 127

(56) References Cited

U.S. PATENT DOCUMENTS

| 5,729,047 | A | * | 3/1998 | Ma .............................. 257/664 |
| 6,133,621 | A | * | 10/2000 | Gaibotti et al. ............. 257/659 |
| 2001/0040274 | A1 | * | 11/2001 | Hidaka ........................ 257/659 |
| 2002/0123160 | A1 | | 9/2002 | Mastromatteo | |

* cited by examiner

*Primary Examiner*—Donghee Kang

(57) ABSTRACT

An interconnect is described including a semiconductor substrate having opposing surfaces, including first and second insulated conductors for transmitting signals. A third conductor substantially surrounds and is electrically insulated from the first and second insulated conductors. Capacitance between the first insulated conductor and the third conductor is substantially equivalent to capacitance between the second insulated conductor and the third conductor. The first insulated conductor and the second insulated conductor are disposed between the opposing surfaces of the semiconductor substrate.

33 Claims, 7 Drawing Sheets

SEMICONDUCTOR DIFFERENTIAL INTERCONNECT

TECHNICAL FIELD

The present invention generally relates to the field of electronic devices and particularly to an interconnect in a semiconductor device.

BACKGROUND

MicroElectroMechanical Systems (MEMS) are a class of devices that integrate small mechanical and electrical components. A single MEMS device may measure from several nanometers to a few microns, with an array of MEMS devices provided within a few millimeters.

MEMS may be integrated with electronic circuitry. For example, a MEMS device may be incorporated with an integrated circuit (IC) to provide expanded functionality, such as microelectric actuators incorporated with electronic circuitry, e.g. an airbag sensor.

To communicatively couple MEMS devices, both between the MEMS devices themselves and with other electronic devices, signals are transmitted between devices. Signals may be transmitted for a variety of purposes, such as for timing, activation, data transfer, and the like.

Electromagnetic interference may limit the ability of a MEMS device to provide desired functionality. For instance, electromagnetic interference (EMI) may limit a signal that is transmitted by an interconnect between devices. The EMI may originate both from outside a system employing a MEMS device as well as within the system itself. To compensate for the EMI, devices may operate at reduced system speeds to enable effective signal passage, provide an interconnect of increased distance between devices to limit exposure of the EMI between the devices, and the like.

To increase signal integrity in a MEMS system, an interconnect that uses differential signaling may be employed. However, previous interconnect structures that provided differential signaling did not preserve the differential signaling with integrity when EMI was encountered. As such, the EMI was incorporated into the differential signaling that was transmitted through the interconnect, thereby decreasing the signal-to-noise ratio of the differential signaling.

Therefore, it would be an advance in the art to provide an interconnect which preserves differential signal integrity.

BRIEF DESCRIPTION OF THE DRAWINGS

The same components are used throughout the drawings to reference like features and components.

DETAILED DESCRIPTION

Overview

Figure 1:
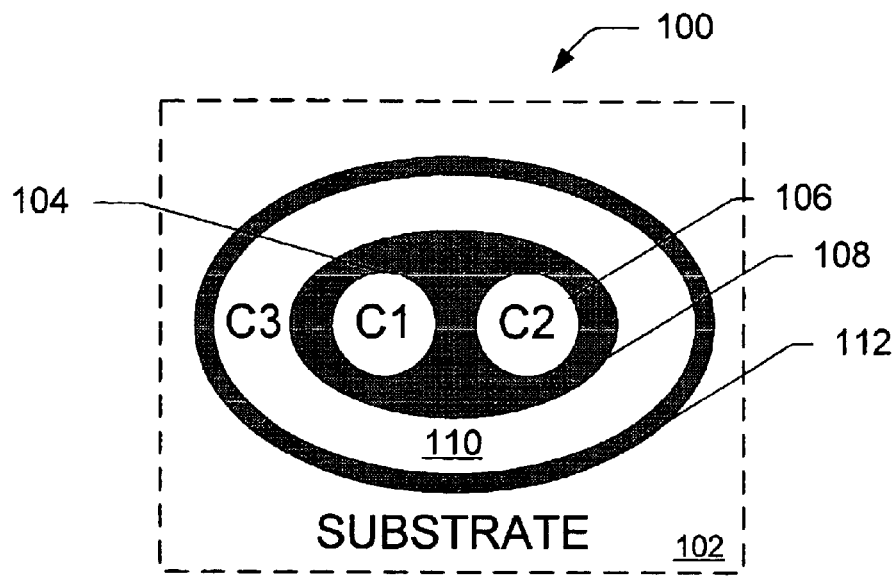
FIG. 1 is an illustration of an exemplary embodiment of the present invention in which a cross-sectional view of an interconnect is shown.

An interconnect with conductors is provided that preserves differential signal integrity. In one embodiment of the present invention, electromagnetic interference (EMI) is symmetrically distributed to conductors of the interconnect whereby the symmetrically distributed EMI may be removed from a differential signal being transmitted through the conductors of the interconnect.

In another embodiment of the present invention, an interconnect includes a first conductor and a second conductor. The first and second conductors each transmit a different portion of a differential signal. The interconnect includes a third conductor that distributes EMI encountered by the third conductor to the first conductor and the second conductor to preserve the integrity of the differential signal in the first and second conductors. The third conductor can be arranged such that the first conductor and the second conductor are exposed to substantially equivalent amounts of EMI. The EMI may then be removed from the differential signal, thereby preserving differential signal integrity.

FIGS. 1 through 12 illustrate exemplary embodiments of an interconnect of the present invention. Each interconnect in each embodiment of the present invention may be used in a variety of electronic device applications, such as in a MicroElectroMechanical system (MEMS). Although the following discussion will describe an interconnect in a MEMS application, a variety of applications are contemplated, such as electronic device applications including memories, semiconductor devices, application specific integrated circuits (ASIC), and the like.

A MEMS device having an interconnect may be constructed so as to be integral with a semiconductor substrate, such as a silicon wafer, polysilicon, glass, and the like, where features of the MEMS device are provided on the semiconductor substrate utilizing a variety of techniques. For example, the fabrication of the interconnect may include deposition, etching, photolithography, micromachining, and other semiconductor fabrication processes.

The semiconductor substrate may transmit EMI from switching circuits, power circuits, and the like which may affect signal transmission. The EMI may degrade signals transmitted through the semiconductor substrate. To increase signal integrity, differential signaling in an interconnect may be employed. Differential signals may be provided through a pair of conductors in the interconnect which are utilized as a reference, one to the other. Because the differential signals transmitted on the conductors are utilized to reference each other, EMI may be removed from the differential signals that are transmitted on the conductors.

For instance, a first conductor in an interconnect may be utilized to carry a first portion of the differential signal, while the second conductor in the interconnect carries a second portion of the differential signal that is equal and opposite to the signal carried on the first conductor (i.e., such as opposite polarity). EMI, which is common between the first conductor and the second conductor, may be subtracted from the differential signal in what may be referred to as common mode rejection, to provide an output signal from the interconnect which is free from the encountered EMI.

In another embodiment of the present invention, a first conductor and a second conductor in an interconnect are utilized to indicate a logical state. Substantially equivalent amounts of EMI are applied to the first and second conductors of the interconnect. The first conductor has a first portion of a differential signal that is higher than a second portion of the differential signal on the second conductor. The difference between these signals indicates a first logical state. If the first conductor has a first portion of a differential signal that is lower than a second portion of the differential signal on the second conductor, a second logical stage is indicated. By referencing the first portion to the second portion, EMI may be removed from the differential signal.

Exemplary Embodiments of the Present Invention

FIG. 1 is a cross-sectional view taken perpendicular to a longitudinal axis of an interconnect 100 that extends into and out of the page. The interconnect 100 is disposed within a semiconductor substrate 102. The term "semiconductor substrate", as used herein, includes semiconductive material. The term is not limited to bulk semiconductive material, such as a silicon wafer, either alone or in assemblies comprising other materials thereon, and semiconductive material layers, either alone or in assemblies comprising other materials. A semiconductor substrate may be made of silicon, polysilicon, gallium arsenide, silicon on sapphire (SOS), epitaxial formations, germanium, germanium silicon, diamond, silicon on insulator (SOI) material, selective implantation of oxygen (SIMOX) substrates, and the like substrate materials. In embodiments of the present invention, the semiconductor substrate 102 is made of silicon, which can be a monocrystalline silicon wafer.

The interconnect 100 includes a first conductor 104 and a second conductor 106. The first conductor 104 and a second conductor 106 provide conductive paths for transmitting signals. The first conductor 104 is proximal to the second conductor 106. A variety of signals may be respectively transmitted by the first conductor 104 and the second conductor 106. For example, the first conductor 104 may transmit a first portion of a differential signal and the second conductor 106 may transmit a second portion of the differential signal. The portions of the differential signal are used as a reference one to the other so that EMI can be removed.

A first insulator 108 is included in the interconnect 100 to electrically insulate the first conductor 104 from the second conductor 106. The first insulator 108 may be formed from a range of electrically-insulating materials, such as dielectric materials and the like. A dielectric material is a substance that is a poor conductor of electricity, but efficiently supports electrostatic fields. Dielectric materials may include porcelain (ceramic), mica, glass, plastics, oxides of various metals, and the like. Liquids and gases may also serve as dielectric materials, such as dry air and distilled water, as well as a vacuum.

The interconnect 100 includes a third conductor 110 which substantially surrounds each of the first conductor 104, the second conductor 106, and the first insulator 108. In the Figures, the first conductor 104 is also referenced as C1, the second conductor 106 is referenced as C2, and the third conductor is referenced as C3. The first insulator 108 electrically insulates the third conductor 110 from both the first conductor 104 and the second conductor 106. A second insulator 112, which substantially surrounds the third conductor 110, electrically insulates the third conductor 110 from the semiconductor substrate 102.

The third conductor 110 can be formed so as to act as a shield to the first and second conductors 104, 106. For example, the third conductor 110 may shield at least a portion of the EMI that it encounters from affecting the first conductor 104 and the second conductor 106. This shielding function may include reflecting EMI, absorbing EMI, and the like.

An amount of EMI may be encountered which is greater than the third conductor 110 is capable of shielding. Here, the third conductor 110 can be formed so as to provide substantially equivalent distributions of EMI to the first and second conductors 104, 106. As such, this equivalent distribution of EMI by the third conductor 110 preserves the integrity of any differential signal that is transmitted through the interconnect 100 via the first and second conductors 104, 106. By providing a substantially equivalent distribution, the EMI can be incorporated within any portion of any differential signal that is respectively transmitted through the first and second conductors 104, 106 so as to be substantially equivalent in both amount and manner. EMI, which is common to both the first conductor 104 and the second conductor 106, may be removed by referencing the signals received from the first conductor and the second conductor 106 to each other, such as through common mode rejection. Thus, because substantially equivalent distributions of EMI were included within the portions of the differential signals, a substantial amount of the EMI may be removed, thereby preserving the integrity of the differential signal.

The interconnect 100 may be formed so as to include several capacitors. For instance, one capacitor can be formed by the third conductor 110 being separated from the semiconductor substrate 102 by the second insulator 112. Likewise, the third conductor 110 may act as a capacitor in combination with the first conductor 104 and the first insulator 108, and in combination with the second conductor 106 and the first insulator 108.

Figure 2:
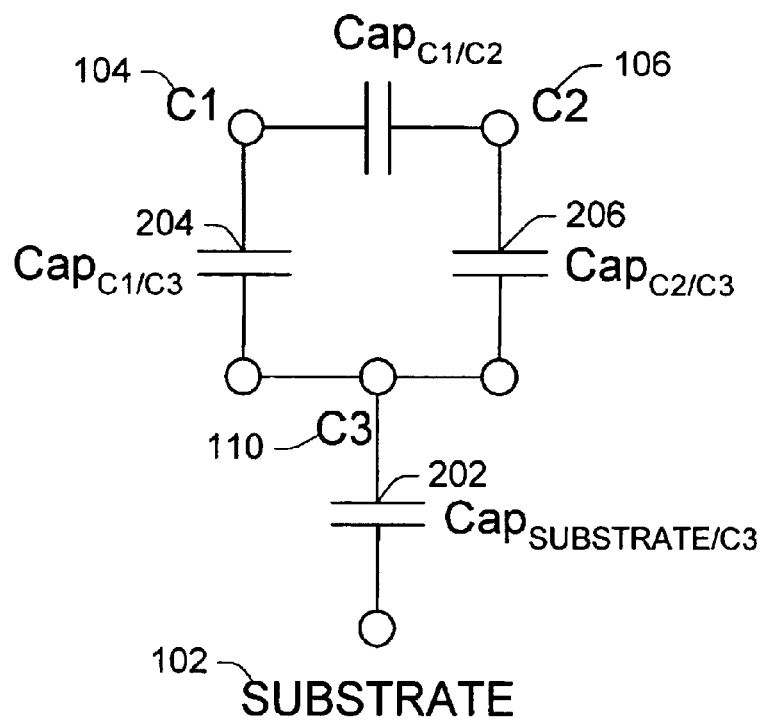
FIG. 2 is a circuit diagram of an exemplary embodiment of the present invention in which capacitance of an interconnect is shown.

FIG. 2 is a circuit diagram illustrating the interconnect 100 of FIG. 1. A first capacitor 202 ($Cap_{substrate/C3}$) is formed from the semiconductor substrate 102, the second insulator 112, and the third conductor 110. A second capacitor 204 ($Cap_{C1/C3}$) is formed from the third conductor 110, the first insulator 108, and the first conductor 104. Likewise, a third capacitor 206 ($Cap_{C2/C3}$) is formed from the third conductor 110, the first insulator 108, and the second conductor 106.

The first capacitor 202 couples EMI from the semiconductor substrate 102 to the third conductor 110. The third conductor 110 symmetrically distributes the EMI using the second capacitor 204 to the first conductor 104, and using the third capacitor 206 to the second conductor 106, respectively. Therefore, a path of EMI to the first conductor 104 from the semiconductor substrate 102 through the third conductor 110 is substantially equivalent to a path of EMI from the semiconductor substrate 102 through the third conductor 110 to the second conductor 106. For example, EMI may be transmitted through the first capacitor 202 to be exposed in substantially equivalent amounts to the first conductor 104 and the second conductor 106 using the second capacitor 204 and the third capacitor 206, respectively.

Overall capacitance from the first conductor 104 to the semiconductor substrate 102 and from the second conductor 106 to the semiconductor substrate 102 is reduced by the presence of the third conductor 110. Thus, the third conductor 110 acts to shield capacitance from the semiconductor substrate 102. Therefore, lower signal strengths may be used in transmitting signals through interconnect 100. One example is a read back signal from a diode sensor that is transmitted through the interconnect, where the read back signal may involve currents on the order of 200 nA and less. Isolating the read back signal from EMI is desirable to maintain signal to noise ratio (SNR) of a differential signal. By providing the third conductor 110 as a shield, signal amplitude may be small with respect to EMI encountered from the semiconductor substrate 102.

Figure 3:
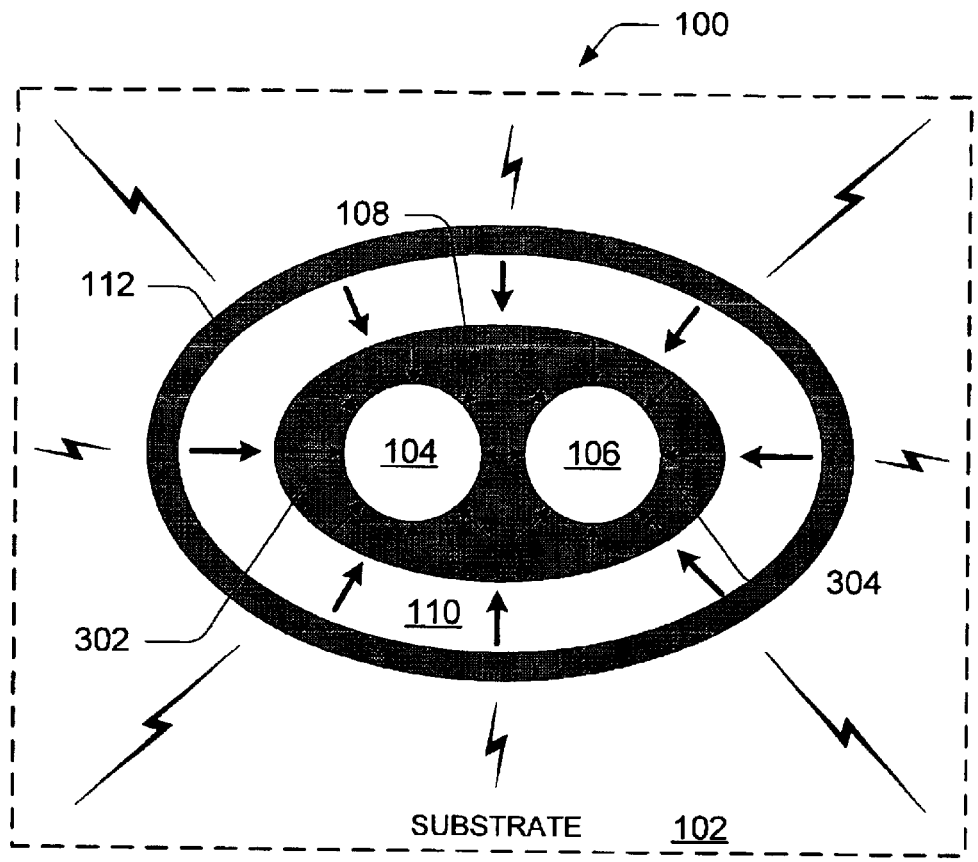
FIG. 3 is an illustration of an exemplary embodiment of the present invention in which symmetry of an interconnect is shown.
Figure 4:
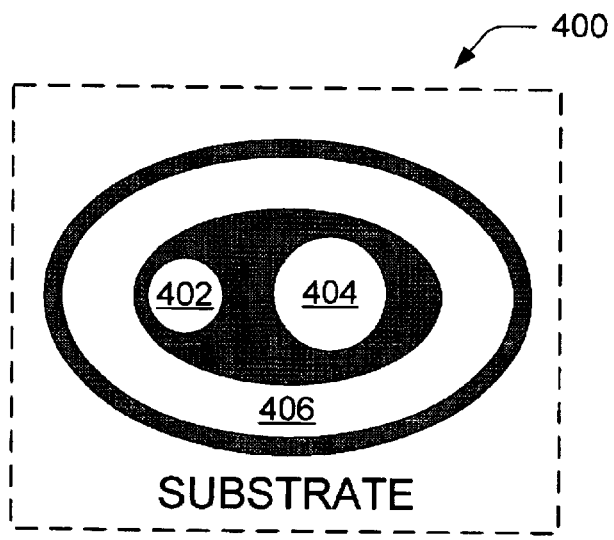
FIG. 4 is an illustration of an exemplary embodiment of the present invention in which asymmetric surface areas of first and second conductors is compensated for by positioning of the first and second conductors to provide substantially equivalent amounts of EMI to the first and second conductors.

FIG. 3 illustrates an embodiment of the present invention wherein symmetry of the interconnect 100 is shown. To provide substantially equivalent amounts of EMI, the interconnect 100 may be symmetrically configured. Symmetrical configuration promotes integrity of the differential signal by exposing corresponding parts of the first conductor 104 and the second conductor 106 to substantially equivalent amounts of EMI.

In an embodiment of the present invention, the interconnect 100 provides substantially equivalent amounts of EMI through symmetrical positioning of the first conductor 104 and the second conductor 106 with respect to the third conductor 110. The first conductor 104 and the second conductor 106 are separated by equal distances from the third conductor 110. Capacitance is inversely proportional to distance between conductors. Therefore, by providing corresponding segments of the first conductor 104 and the second conductor 106 at the corresponding distance, capacitance between the first conductor 104 and the third conductor 110 is substantially equivalent to capacitance between the second conductor 106 and the third conductor 110. Further, through use of the third conductor 110, capacitance between the semiconductor substrate 102 and the first conductor 104 is substantially equivalent to capacitance between the semiconductor substrate 102 and the second conductor 106.

In an additional embodiment of the present invention, substantially equivalent amounts of EMI are provided based on configuration of the respective surface areas of the first conductor 104, the second conductor 106, and the third conductor 110. Capacitance is directly proportional to surface areas of the conductors. Therefore, capacitance between the first conductor 104 and the third conductor 110 may be varied based on surface area, such as by varying surface area of one or both of the first conductor 104 and the third conductor 110. Likewise, the surface area of the second conductor 106 may also be varied with respect to the third conductor 110 to vary capacitance. For example, during a manufacturing process, the first conductor 104, the second conductor 106, and the third conductor 110 may be formed to have surfaces areas to increase or decrease capacitance between the first conductor 104 and the third conductor 110 and the capacitance between the second conductor 106 and the third conductor 110. By increasing or decreasing the capacitance when manufacturing the interconnect 100, substantially equivalent amount of EMI may be transmitted to the first and second conductors 104, 106 during use of the interconnect 100.

In a further embodiment of the present invention, substantially equivalent amounts of EMI are provided based on insulators used. Capacitance also depends on a dielectric constant of a dielectric separating the conductors of a capacitor, such as the first insulator 108 and second insulator 112. By varying the dielectric constant of parts of the first insulator 108 disposed between the first conductor 104, the second conductor 106 and the third conductor 110, capacitance may be varied as desired. For example, an embodiment may include an insulator 108 having different dielectric constants of a first part 302 of the first insulator 108 disposed between the first conductor 104 and the third conductor 110 as opposed to a second part 304 of the first insulator 108 disposed the second conductor 106 and the third conductor. Additionally, the second insulator 112, disposed between the third conductor 110 and the semiconductor substrate 102, may have a dielectric constant to produce a variety of results, such as increased shielding, increased transmittance, and the like.

The interconnect 100 may assume a variety of configurations yet still provide substantially equivalent amounts of EMI. For example, substantially equivalent amounts of EMI may be provided when designing an interconnect through symmetrical shielding and/or distribution of EMI and/or capacitance from the third conductor 110 to the first conductor 104 and the second conductor 106. Additionally, different combinations of factors may be used to achieve a desired result. As shown in the exemplary embodiment of the present invention depicted in FIG. 4, combinations of factors may be used to provide substantially equivalent amounts of EMI. By varying at least two of distance, surface area and materials used in forming an interconnect 400, factors may be used in combination to provide substantially equivalent amounts of EMI. For example, factors such as distance and surface area of a first conductor 402, a second conductor 404 and/or a third conductor 406 of the interconnect 400 may be compensated for by another factor. The first conductor 402 may be formed with a smaller surface area than the second conductor 404, but is positioned closer to the third conductor 406 than the position of the second conductor 404. Likewise dielectric constants of material may be varied, as described in relation to FIG. 4, between the first, second and third conductors 402, 404, and 406 to compensate for varying distances. Therefore, substantially equivalent amounts of EMI are provided to the third conductor 406 to the first and second conductors 402, 404.

Figure 5:
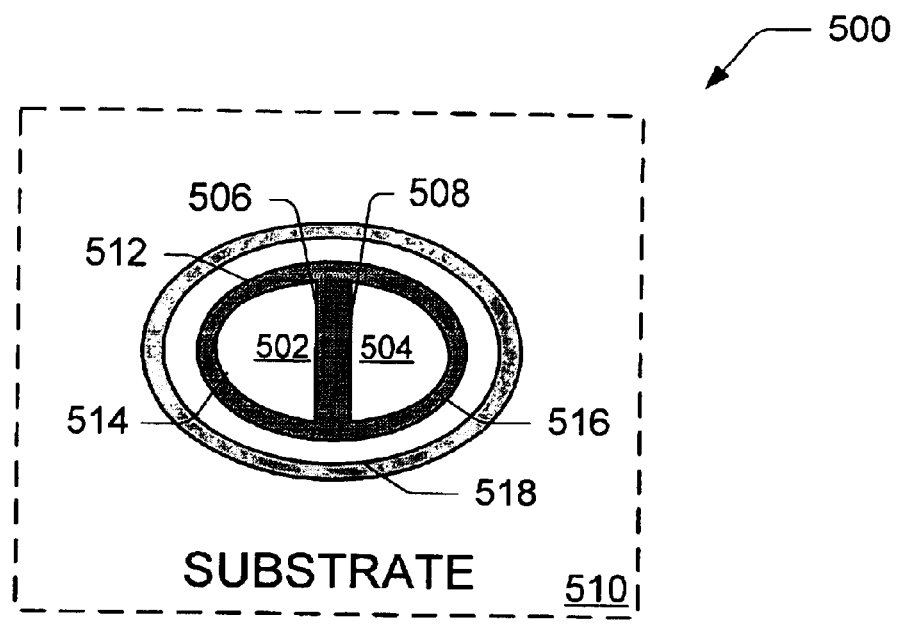
FIG. 5 is an illustration of an exemplary embodiment of the present invention in which an interconnect with D-shaped conductors is shown.
Figure 6:
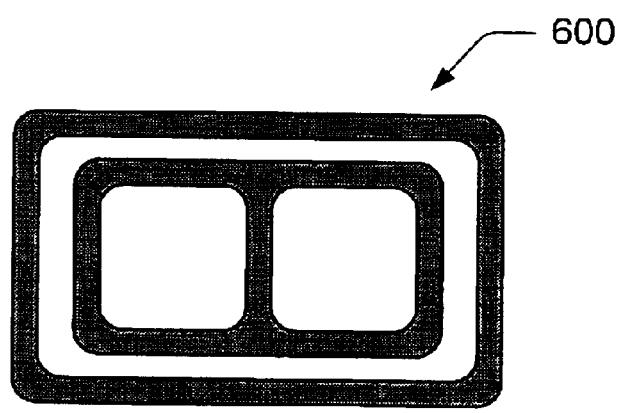
FIG. 6 is an illustration of an exemplary embodiment of the present invention in which an interconnect with rectangular-shaped conductors is shown.

FIG. 5 illustrates an exemplary embodiment of the present invention wherein an interconnect 500 with a reduced cross-sectional area is shown. To provide a smaller cross-sectional area of the interconnect 500, a first conductor 502 and a second conductor 504 may be formed to have opposing substantially parallel planar sides 506 and 508. The substantially parallel planar sides 506, 508 of the first and second conductors 502, 504 enable closer positioning and therefore results in a smaller cross-sectional area of the interconnect 500.

The thickness of the first insulator 512 surrounding the first and second conductors 502 and 504 may also be configured to achieve desired results. For example, to achieve a generally uniform thickness of the first insulator 512, the outer surfaces 514 and 516 of the first conductor 502 and the second conductor 504 are formed in a generally elliptical shape. The outer surfaces 514 and 516 are at corresponding distances from the third conductor 518. The third conductor 518 is formed to have a shape which corresponds to a shape of the outer surfaces 514 and 516 of the first and second conductors 502 and 504. Through the combination of the generally elliptical shape of the outer surfaces 514 and 516 and the substantially planar opposing sides 506 and 508 of the first conductor 502 and the second conductor 504, a generally D-shaped structure is provided. This D-shaped structure provides a smaller cross-sectional area of the interconnect 500. The cross-sections depicted in FIG. 5 are taken from a plane perpendicular to a longitudinal axis of each of the first and second conductors 502, 504. Moreover, the first conductor 502, the second conductor 504, and the third conductor 518 may be formed in a variety of shapes, such as a rectangular interconnect 600 shown in the exemplary embodiment of the present invention depicted in FIG. 6, polygonal, rounded, and the like.

Figure 7:
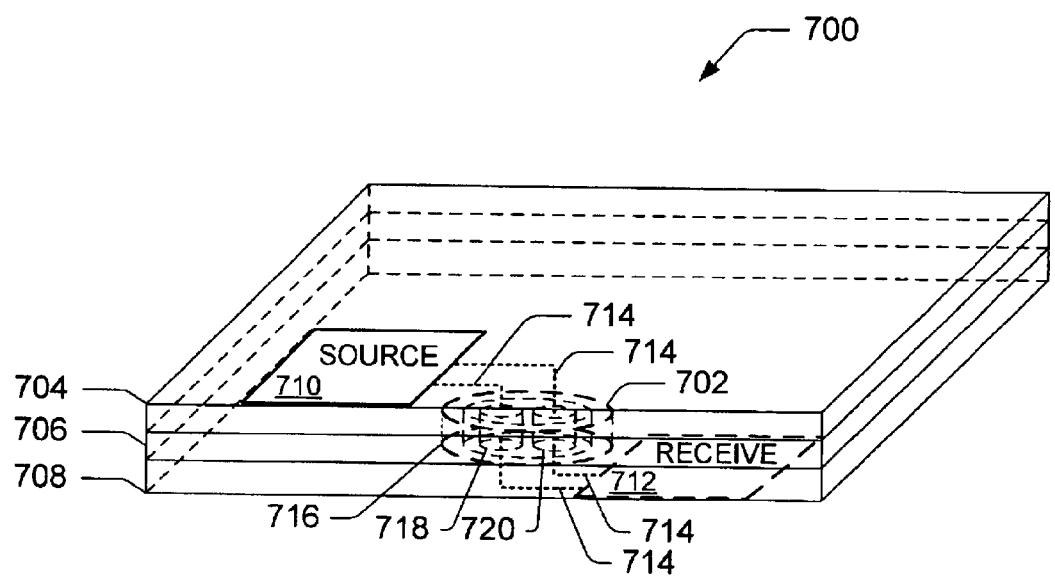
FIG. 7 is an illustration of an exemplary embodiment of the present invention in which a semiconductor device employing an interconnect is shown.

FIG. 7 is an illustration of an exemplary embodiment of the present invention in which a semiconductor device 700 employing an interconnect 702 is shown. The semiconductor device 700, which is shown in phantom, is portion of a MEMS assembly (not shown). The semiconductor device 700 includes a first layer 704, a second layer 706 and a third layer 708 formed from a semiconductor substrate. The second layer 706 is disposed between the first layer 704 and the third layer 708. The first, second and third layers 604, 706 and 708 are formed from a semiconductor substrate. The interconnect 702 can be used to transmit signals between layers 704–708.

A source device 710, which outputs a differential signal, is disposed in the first layer 704. The source device 710 may include a wide range of electrical devices, MEMS devices, and the like. To transmit a signal from the source device 710 to a receiving device 712, which is shown in phantom, disposed in the third layer 708, the interconnect 702 is provided in the second layer 706. The receiving device 712 may also include a wide range of electrical devices (e.g. a differential signal amplifier), MEMS devices, and the like.

The source device 710 and the receiving device 712 may be communicatively coupled to the interconnect 702 in a variety of ways. For example, a metallization 714 to the interconnect 702 may be provided to transmit signals from the source device 710 to the interconnect 702, or to transmit signals from the interconnect 702 to the receiving device 712. The metallization 714 can be, for instance, a via, a metal contact, and the like.

During fabrication of the semiconductor device 700, and prior to the formation of a third conductor 716, a passage may be provided to first and second conductors 718 and 720 so that the metallization 714 may be formed. The third conductor 716 still substantially surrounds the first conductor 718 and the second conductor 720 along a substantial portion of a longitudinal axis of each of the first conductor 718 and the second conductor 720.

Although the semiconductor device 700 configured as a three-layered structure is shown, the interconnect 702 may be incorporated in layers in a variety of ways. For example, the interconnect 702 may supply a conductive path for signals to connect layers disposed on opposing sides of the second layer 706, such as a bottom layer to a top layer, and even a top surface and bottom surface of the second layer 706 itself. Additionally, the interconnect 702 may be extended through multiple layers, such as through a series of interconnects 702, a single multilayer interconnect 702, and the like.

Exemplary Embodiments—Methods

Figure 8:
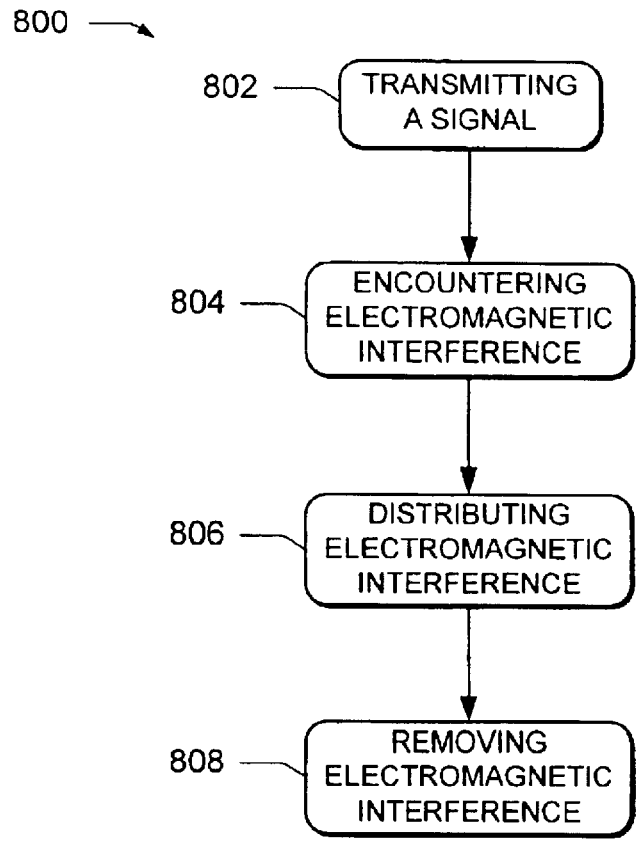
FIG. 8 is a flow diagram depicting an exemplary embodiment of the present invention in which encountered electromagnetic interference is distributed and removed from a transmitted signal.

FIG. 8 is a flow chart depicting an embodiment of the present invention that illustrates an exemplary method 800 in which a signal is transmitted utilizing the interconnect 100. At block 802, a differential signal is transmitted through the interconnect 100 including the first conductor 104 and the second conductor 106. The differential signal may be provided to indicate a logical state, pass data, and the like. A first portion of the differential signal is transmitted through the first conductor 104 and a second portion of the differential signal is transmitted through the second conductor 106.

At block 804, EMI is encountered by the interconnect 100. For example, EMI may be transmitted through the semiconductor substrate 102 to the interconnect 100. The EMI may have a variety of sources, such as from power supplies, switching, and the like, as well as from a source that is outside a semiconductor device in a MEMS assembly employing the interconnect 100.

At block 806, the encountered EMI is distributed to the first conductor 104 and the second conductor 106. The EMI is distributed by the third conductor 110 so that the first conductor 104 and the second conductor 106 are symmetrically exposed. For instance, any EMI which is not shielded by the third conductor 110 from the first and conductors 104, 106 will be symmetrically distributed to the first and conductors 104, 106 so that substantially equivalent amounts of EMI are encountered. The substantially equivalent amounts of the symmetrically distributed EMI are incorporated into the differential signals being respectively transmitted through the first and second conductors 104 and 106.

At block 808, the EMI is removed from the differential signal. The EMI may be removed from the differential signal by referencing the first portion of the differential signal received from the first conductor 104 with the second portion of the differential signal received from the second conductor 106. For example, because the first portion and the second portion of the differential signal have substantially equivalent amounts of the symmetrically distributed EMI, the EMI may be removed through common mode rejection. Thus, the differential signal that is transmitted through the interconnect 100 is substantially free of the EMI that was encountered by the third conductor 110.

It should be noted that in additional embodiments of the present invention, substantially equivalent amounts of EMI included in each of the first conductor 104 and the second conductor 106 may vary from one-to-one correspondence. For example, a designer of an embodiment of the present invention may configure the interconnect 100 to provide a desired signal-to-noise ratio to achieve desired functionality.

Figure 9:
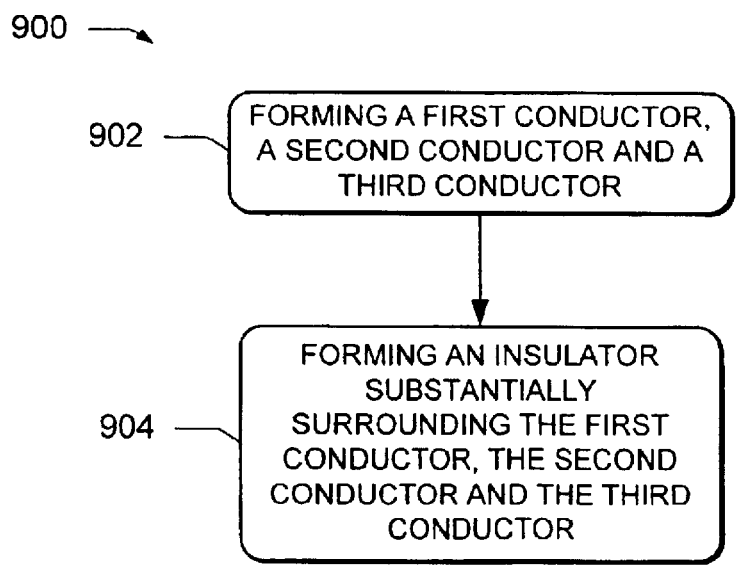
FIG. 9 is a flow diagram depicting an exemplary embodiment of the present invention in which an interconnect is formed.

FIG. 9 is a flow chart depicting an embodiment of the present invention that illustrates an exemplary method 900 wherein an interconnect is produced. At block 902, a first conductor, a second conductor and a third conductor are formed from a semiconductor substrate. There are a variety of forming procedures that may be employed. For example, forming may include removing material from the semiconductor substrate so that the first conductor, second conductor and third conductor are defined in the semiconductor substrate. Material may be removed through steps which include etching (such as dry, wet, ion etching, etc., that results in isotropic and/or anisotropic etched surfaces) micro-machining, photolithography combined with etching, and the like.

Figure 10:
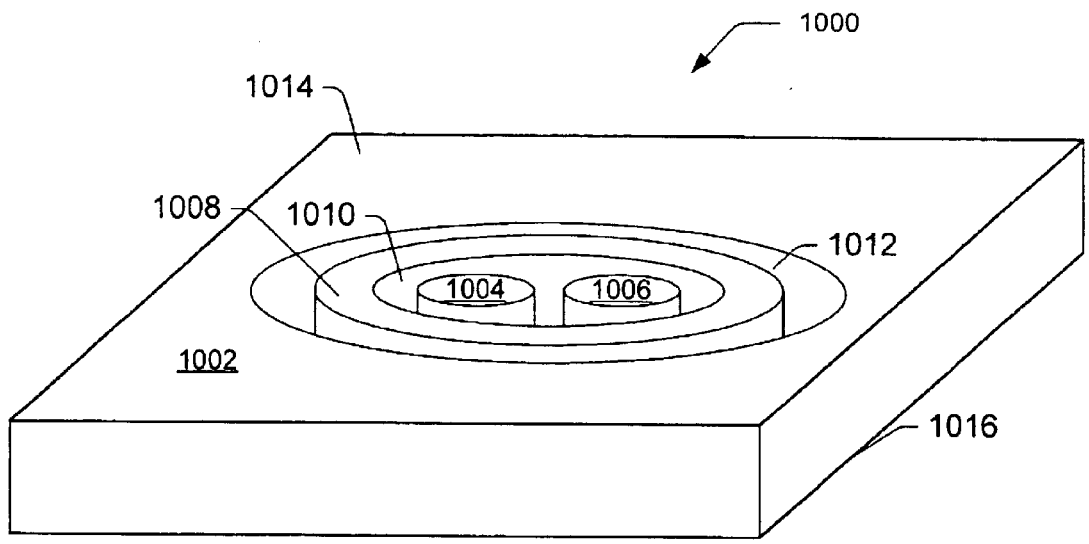
FIG. 10 is an illustration of an exemplary embodiment of the present invention in which conductors of an interconnect are formed from a semiconductor substrate.
Figure 11:
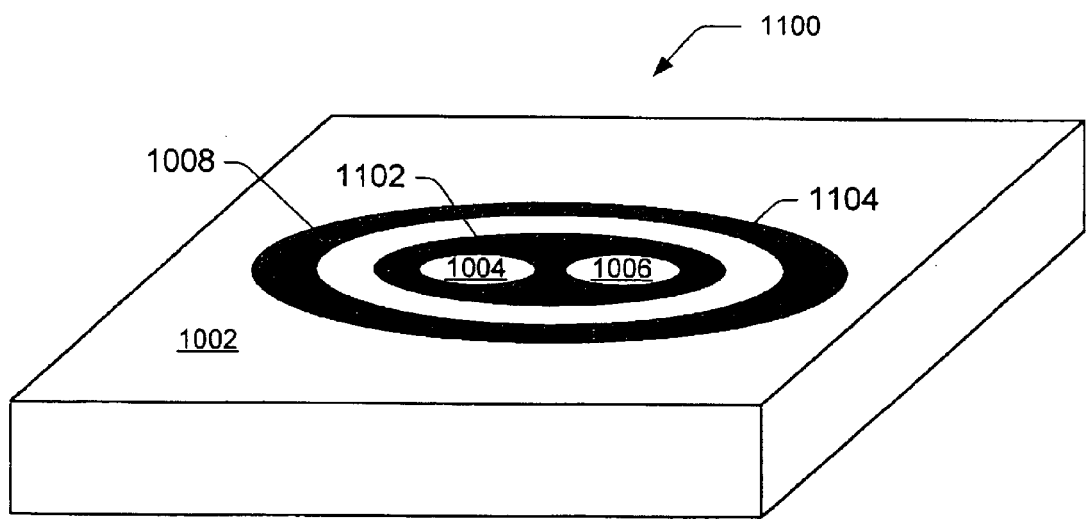
FIG. 11 is a further illustration of the exemplary embodiment of the present invention as depicted in FIG. 10 and in which an insulator is formed which substantially surrounds the conductors of the interconnect.

An illustrative embodiment of the present invention is seen in FIG. 10, where a semiconductor device 1000 includes a semiconductor substrate 1002 having a first conductor 1004, a second conductor 1006, and a third conductor 1008. A first channel 1010 and a second channel 1012, formed by the removal of material from the semiconductor substrate 1002, define the first conductor 1004, the second conductor 1006 and the third conductor 1008 in the semiconductor substrate 1002.

The first conductor 1004, second conductor 1006, and third conductor 1008 which are used to form an interconnect may be disposed between opposing surfaces 1014, 1016 of the semiconductor substrate 1002. In one exemplary embodiment, the first, second and third conductors 1004, 1006, 1008 may be formed as generally perpendicular to a plane defined by the semiconductor substrate 1002 of the semiconductor device 1000. This may be thought of as a vertical orientation, which shall be used to reference the orientation of the first, second and third conductors 1004, 1006, 1008 with respect to the semiconductor substrate 1002. Therefore, vertical orientation is not limited to general orientations in space. By defining the first, second and third conductors 1004, 1006, 1008 between the opposing surfaces 1014, 1016 of the semiconductor substrate 1002, signals may be passed through the semiconductor substrate 1002.

Referring again to method 900 in FIG. 9, an electrical insulator is formed at block 904. The insulator substantially surrounds the first conductor, the second conductor and the third conductor. The insulator may be formed in a variety of ways, such as through growing an oxide, depositing insulative material, and the like. As shown by an embodiment of the present invention in a semiconductor device 1100 depicted in FIG. 11, a first insulator 1102 and a second insulator 1104 fill the first channel 1010 and the second channel 1012 formed in the semiconductor substrate 1002 shown in FIG. 10.

Figure 12:
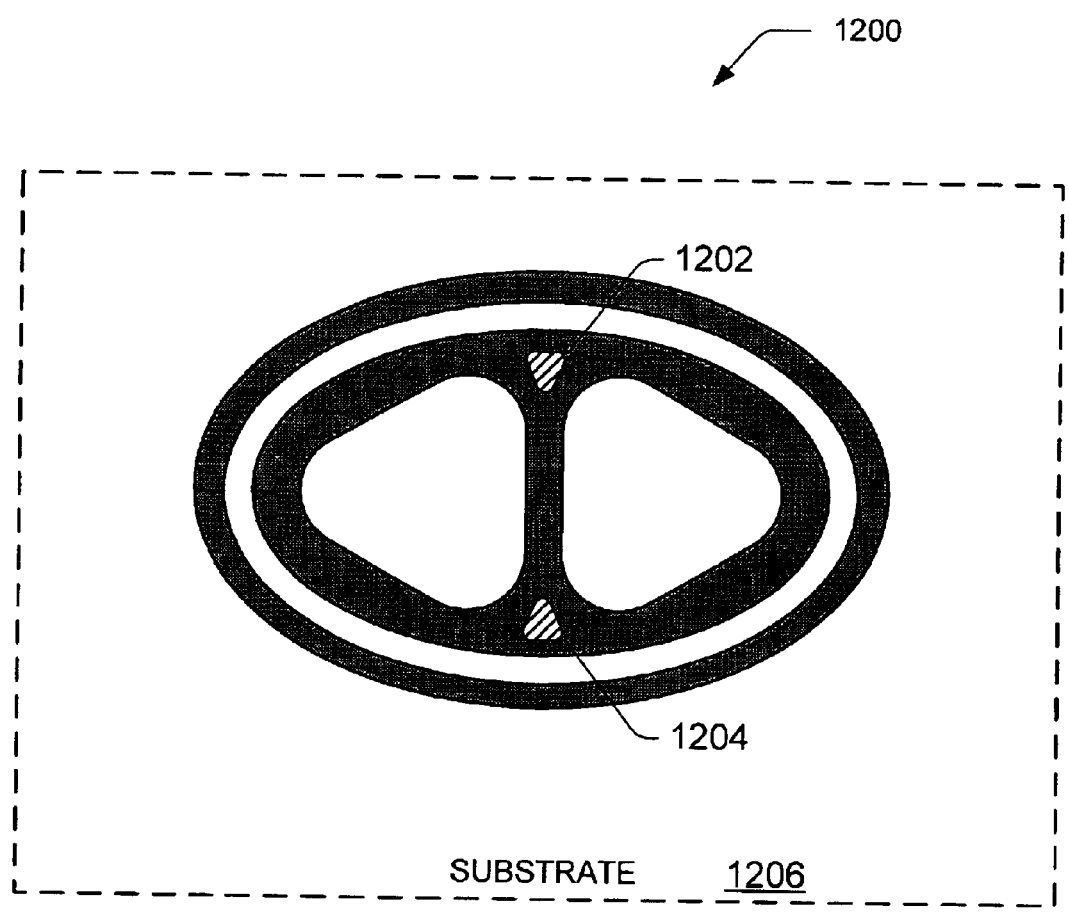
FIG. 12 is an illustration of an exemplary embodiment of the present invention in which openings in an insulator are filled, where the openings were formed when the insulator was grown.

FIG. 12 is an illustration of an embodiment of the present invention for the interconnect 1200 in which insulator is provided through multiple steps. When growing an oxide to provide an insulator as described previously respect to FIGS. 10–11, openings may be produced in which the oxide does not grow, such as a first opening 1202 and a second opening 1204. The first opening 1202 and the second opening 1204 may hinder structural integrity of the interconnect 1200, as well as the semiconductor substrate 1206 having the interconnect 1200. Therefore, the first opening 1202 and the second opening 1204 may be filled, such as with a structural material, to provide structure rigidity to the interconnect 1200. A variety of materials may be used as fill, such as polysilicon, and the like.

Although the invention has been described in language specific to structural features and methodological steps, it is to be understood that the invention defined in the appended claims is not necessarily limited to the specific features or steps described. Rather, the specific features and steps are disclosed as preferred forms of implementing the claimed invention.

What is claimed is:

1. An interconnect, comprising:
   a semiconductor substrate having opposing surfaces, including:
      a first insulated conductor for transmitting signals;
      a second insulated conductor for transmitting signals; and
      a third conductor substantially surrounding and electrically insulated from the first and second insulated conductors, wherein:
      capacitance between the first insulated conductor and the third conductor is substantially equivalent to capacitance between the second insulated conductor and the third conductor; and
      the first and the second insulated conductors are disposed between the opposing surfaces of the semiconductor substrate.

2. The interconnect as described in claim 1, wherein capacitance is substantially equivalent between:
   the first insulated conductor and the semiconductor substrate; and
   the second insulated conductor and the semiconductor substrate.

3. The interconnect as described in claim 1, wherein the shape of each of the third conductor, the first insulated conductor, and the second insulated conductor is such that electromagnetic interference encountered by the third conductor is symmetrically distributed to the first conductor and the second conductor.

4. The interconnect as described in claim 1, wherein the third conductor shields the first insulated conductor and the second insulated conductor from at least a portion of electromagnetic interference provided within the semiconductor substrate.

5. The interconnect as described in claim 1, wherein capacitance between the first insulated conductor and the third conductor, and between the second insulated conductor and the third conductor, is substantially equivalent so that the first insulated conductor and the second insulated conductor are exposed to corresponding amounts of electromagnetic interference.

6. An apparatus, comprising:
   a first capacitor including a first conductor and a second conductor, the second conductor disposed within the first conductor, wherein:
      the second conductor transmits a signal;
      a first insulator is disposed between the first conductor and the second conductor; and
      the first and second conductors are disposed in a semiconductor substrate generally perpendicular to a plane of the semiconductor substrate;
   a second capacitor including the first conductor and a third conductor, the third conductor disposed within the first conductor, wherein:
      the third conductor transmits a signal;
      the first insulator is disposed between the first conductor and the third conductor; and
      the first and third conductors are disposed in the semiconductor substrate generally perpendicular to the plane of the semiconductor substrate;
   a third capacitor including a semiconductor substrate and the first conductor, wherein a second insulator is disposed between the semiconductor substrate and the first conductor;
   wherein capacitance of the first capacitor and the third capacitor is substantially equivalent to capacitance of the second capacitor and the third capacitor.

7. The apparatus as described in claim 6, wherein positioning of the second conductor and the third conductor is symmetrical with respect to the first conductor.

8. The apparatus as described in claim 6, wherein corresponding portions of the second conductor and the third conductor are exposed to corresponding amounts of electromagnetic interference from the first conductor.

9. The apparatus as described in claim 6, wherein capacitance of the first capacitor and the second capacitor is substantially equivalent.

10. A MicroElectroMechanical system (MEMS), comprising:
   a first conductor for transmitting a signal;
   a second conductor for transmitting a signal;
   a first insulator substantially surrounding the first conductor and the second conductor:
   a third conductor which substantially surrounds the first conductor, the second conductor, and the first insulator;
   a second insulator substantially surrounding the third conductor; and
   a semiconductor substrate having opposing surfaces, wherein:
      capacitance of a path from the semiconductor substrate through the third conductor to the first conductor is substantially equivalent to capacitance of a path from the semiconductor substrate through the third conductor to the second conductor; and
      the first and second conductors are defined between the opposing surfaces.

11. The MicroElectroMechanical system as described in claim 10, wherein electromagnetic interference encountered by the third conductor is symmetrically distributed to the first conductor and the second conductor.

12. The MicroElectroMechanical system as described in claim 10, wherein the third conductor shields the first conductor and the second conductor from at least a portion of electromagnetic interference encountered from the semiconductor substrate.

13. An electronic device comprising:
   an interconnect having:
      a first conductive path for transmitting a signal;
      a second conductive path for transmitting a signal;
      a first insulator substantially surrounding the first conductive path and the second conductive path;
      a shield which substantially surrounds the first conductive path, the second conductive path, and the first insulator; and
      a second insulator substantially surrounding the shield; and
   a semiconductor substrate adjacent to the shield such that capacitance from the semiconductor substrate to the shield to the first conductive path is substantially equivalent to capacitance from the semiconductor substrate to the shield to the second conductive path, wherein the interconnect is disposed vertically in the semiconductor substrate.

14. The electronic device as described in claim 13, wherein at least one of the first insulator and the second insulator are formed from a dielectric material.

15. The electronic device as described in claim 13, wherein electromagnetic interference encountered by the shield is distributed to the first conductive path and the second conductive path in a substantially symmetrical manner.

16. The electronic device as described in claim 13, wherein the shield shields the first conductive path and the second conductive path from at least a portion of electromagnetic interference provided within the semiconductor substrate.

17. The electronic device as described in claim 13, wherein a first portion of a differential signal is transmitted on the first conductive path and a second portion of the differential signal is transmitted on the second conductive path.

18. An interconnect for transmitting a signal comprising:
   a first insulated conductor disposed within a semiconductor substrate;
   a second insulated conductor disposed within the semiconductor substrate; and
   a third conductor disposed within the semiconductor substrate and substantially surrounding the first and second insulated conductors so as to be symmetrical with respect to the first and second insulated conductors, wherein the third conductor is disposed perpendicular to a plane of the substrate.

19. The interconnect as described in claim 18, further comprising opposing ends of the interconnect between which the signal is transmitted.

20. The interconnect as described in claim 18, further comprising a dielectric electrically insulating and surrounding the third conductor.

21. An interconnect for transmitting a signal comprising:
   a plurality of insulated conductors disposed within a semiconductor substrate; and
   a shield disposed within the semiconductor substrate, the shield substantially surrounding the plurality of insulated conductors, wherein each of the insulated conductors receives a distribution of substantially equivalent amounts of EMI.

22. The interconnect as described in claim 21, further comprising opposing ends of the interconnect between which the signal is transmitted.

23. The interconnect as described in claim 21, further comprising a dielectric electrically insulating and surrounding the third conductor.

24. A semiconductor device, comprising:
   a first conductor for transmitting a signal, the first conductor disposed between opposing surfaces of a semiconductor substrate;
   a second conductor for transmitting a signal, the insulated conductor disposed between the opposing surfaces of the semiconductor substrate; and
   a third conductor disposed within the semiconductor substrate which substantially surrounds the first conductor and the second conductor,
   wherein capacitance of the first conductor and the third conductor through configuration of corresponding surfaces areas of the first conductor and the third conductor, positioning the first conductor with respect to the third conductor, and resistance between the first conductor and the third conductor is substantially equivalent to capacitance of the second conductor and the third conductor through configuration of corresponding surfaces areas of the second conductor and the third conductor, positioning the second conductor with respect to the third conductor, and resistance between the second conductor and the third conductor.

25. A semiconductor device, comprising:
   a first means for conducting a signal through a semiconductor substrate;
   a second means for conducting a signal through the semiconductor substrate; and
   means, substantially surrounding the first conducting means and the second conducting means, for symmetrically distributing encountered electromagnetic interference to the first conducting means and the second conducting means.

26. The semiconductor device as defined in claim 25, wherein:

the means for symmetrically distributing encountered electromagnetic interference is symmetrical with respect to the first and second means.

27. The semiconductor device as defined in claim 25, wherein the first and second means are symmetrical about a plane there between.

28. A method, comprising:

in an interconnect disposed between opposing surfaces of a semiconductor substrate, the interconnect having a first conductor and a second conductor, the first and second conductors disposed within a third conductor, encountering electromagnetic interference with the third conductor; and symmetrically distributing the encountered electromagnetic interference to the first conductor and the second conductor from the third conductor.

29. The method as described in claim 28, further comprising transmitting a differential signal through the interconnect, wherein a first portion of the differential signal is transmitted through the first conductor and a second portion of the differential signal is transmitted through the second conductor.

30. The method as described in claim 28, further comprising removing the distributed electromagnetic interference from the differential signal.

31. The method as described in claim 30, wherein the distributed electromagnetic interference is removed using common mode rejection.

32. The method as described in claim 28, further comprising shielding at least a portion of electromagnetic interference, originating from the semiconductor substrate and encountered by the third conductor, from the first conductor and the second conductor.

33. The method as described in claim 28, wherein at least a portion of the symmetrically distributed electromagnetic interference is incorporated in a first portion of a differential signal transmitted through the first conductor and is incorporated in a second portion of the differential signal transmitted through the second conductor.

* * * * *